(12) United States Patent
Nicole et al.

(10) Patent No.: US 8,493,160 B2
(45) Date of Patent: Jul. 23, 2013

(54) ELECTROMAGNETIC SIGNAL POWER LIMITER AND METHOD OF DESIGNING THE POWER LIMITER

(75) Inventors: Pierre Nicole, Saint-Cloud (FR); Alain Phommahaxay, Noisy le Grand (FR); Gaelle Lissorgues, Le Perreux sur Marne (FR)

(73) Assignee: Thales, Neuilly sur Seine (FR)

( * ) Notice: Subject to any disclaimer, the term of this patent is extended or adjusted under 35 U.S.C. 154(b) by 455 days.

(21) Appl. No.: 12/745,035

(22) PCT Filed: Nov. 27, 2008

(86) PCT No.: PCT/EP2008/066372
§ 371 (c)(1),
(2), (4) Date: Nov. 24, 2010

(87) PCT Pub. No.: WO2009/068632
PCT Pub. Date: Jun. 4, 2009

(65) Prior Publication Data
US 2011/0057740 A1 Mar. 10, 2011

(30) Foreign Application Priority Data
Nov. 27, 2007 (FR) ..................... 07 08291

(51) Int. Cl.
*H01P 1/22* (2006.01)

(52) U.S. Cl.
USPC ........................ 333/17.2; 333/81 A

(58) Field of Classification Search
USPC ............. 333/81 R, 81 A, 81 B, 17.2; 327/309
See application file for complete search history.

(56) References Cited

U.S. PATENT DOCUMENTS

| 4,891,730 A | 1/1990 | Saddow et al. |
| 5,047,829 A | 9/1991 | Seymour et al. |
| 6,353,290 B1 | 3/2002 | Glenn et al. |
| 2002/0180552 A1* | 12/2002 | Bennett et al. ............... 333/17.2 |
| 2007/0222534 A1 | 9/2007 | Hannah et al. |

FOREIGN PATENT DOCUMENTS
EP 0458505 11/1991

* cited by examiner

*Primary Examiner* — Stephen Jones
(74) *Attorney, Agent, or Firm* — Stroock & Stroock & Lavan LLP

(57) ABSTRACT

The present invention relates to an electromagnetic signal power limiter and its design method. The power limiter for an electromagnetic signal includes at least one transmission line for the signal. The transmission line is made up of a number of passive micro-diodes with ballistic electron transport. The micro-diodes are distributed on the transmission line, and are implemented in a controlled atmosphere. The invention applies notably to radiofrequency or hyperfrequency waves received by detection and communication devices.

34 Claims, 7 Drawing Sheets

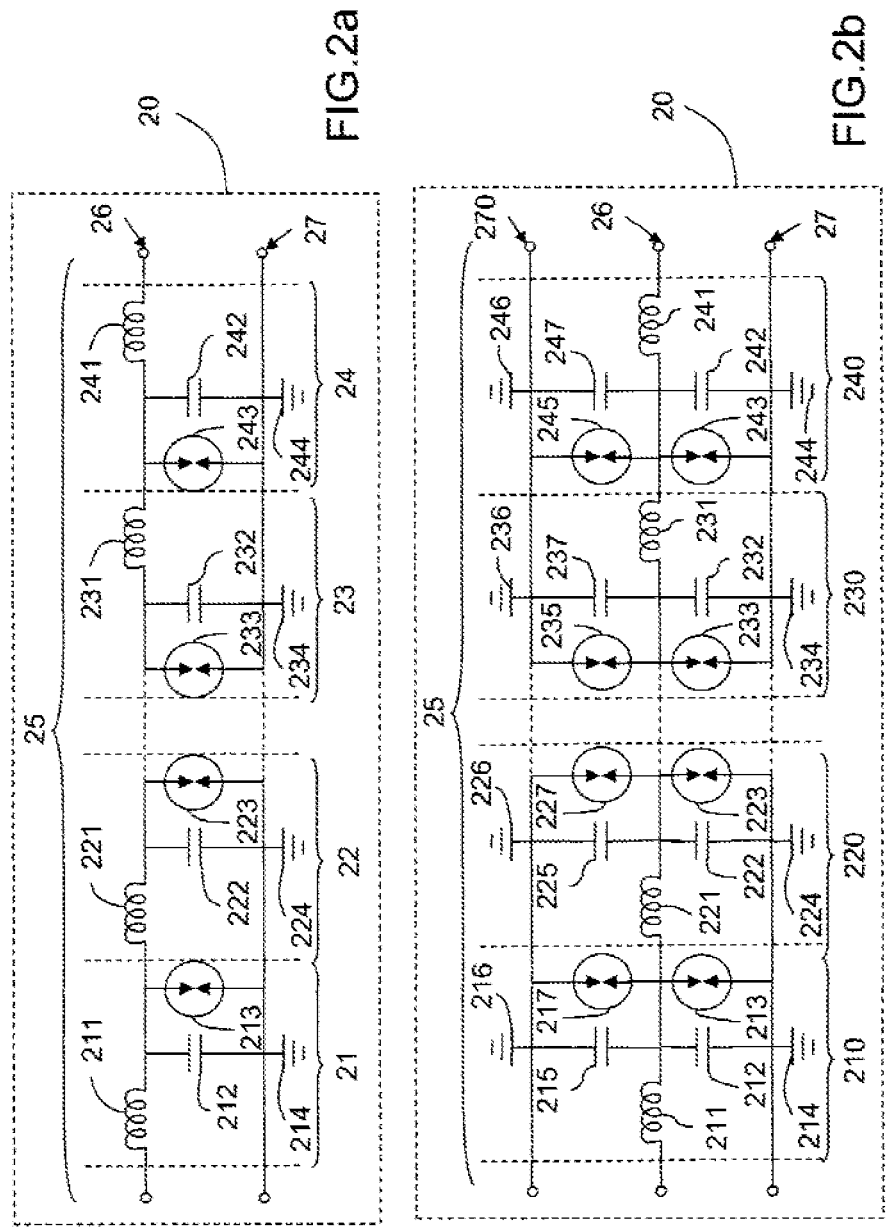

ELECTROMAGNETIC SIGNAL POWER LIMITER AND METHOD OF DESIGNING THE POWER LIMITER

CROSS REFERENCE TO RELATED APPLICATIONS

This application is the U.S. National Phase application under 35 U.S.C. §371 of International Application No. PCT/EP2008/066372, filed Nov. 27, 2008, and claims the benefit of French Patent Application No. 0708291, filed Nov. 27, 2007, all of which are incorporated by reference herein. The International Application was published on Jun. 4, 2009 as WO 2009/068632.

FIELD OF THE INVENTION

The present invention relates to an electromagnetic signal power limiter, notably for radiofrequency or hyper frequency waves received by detection and communication devices. The invention also relates to a method of designing the power limiter according to the invention.

BACKGROUND

Applications based on detections and communications by radiofrequency or hyper frequency waves require the capability to process electromagnetic signals that have significant dynamics. Examples of such applications are systems receiving electromagnetic waves, such as radiofrequency stations and radar wave receivers.

The dynamics of the signals are increasingly significant in increasingly dense electromagnetic environments in which the signals overlap in time. In this situation, signal processing subsystems can be saturated by powers received by an antenna system.

For example, in receiver stations with frequency modulation, there is a threshold beyond which a received signal is no longer usable.

A signal power limiter device is generally used before signal amplifiers in a received signal processing subsystem. A power limiter device can conventionally be produced from an assembly of semiconductor diodes. Such a limiter device may be effective for protecting sensitive electronic circuits situated downstream of the limiter in a digital signal processing subsystem. However, such a limiter has the major drawback of distorting the signals to the point that they can no longer be used by the digital processing subsystems. In particular, the phase of the attenuated signals is not retained. Furthermore, the goniometry and/or signal source locating processing operations then become inoperative. Such locating processing operations are notably used by new generation base stations in radiocommunication systems.

New generations of wireless communication terminals are therefore faced with increasingly difficult problems associated with three types of antinomic constraints:

the first constraint is to detect, recognize and use signals that are increasingly varied in terms of power and frequency, notably for all types of emissions, in all the wavelength bands, for the most diverse radiocommunication sets, from tactical sets to portable telephones, and do so over a very wide band spanning a few hundreds of megahertz to several gigahertz;

a second constraint is to be protected against signal interferences, the peak power of which will increase in time given the current technical developments;

a third constraint is to accurately locate in space, to within a fraction of a degree for example, all the sources emitting electromagnetic signals by wide band interferometry techniques. A saturation of the receiving subsystems leads to a loss of the signals, in which case a processing of the signal phases is pointless. It is therefore useful to have a function that allows a phase measurement while the various signals are being received. This type of function does not currently exist, notably because the receivers are sensitive to saturation, even when they are protected by current power limiting devices.

One function of a limiter, placed immediately after a receiving antenna, is notably to avoid saturation or disabling, potentially to the point of destruction, of the sensitive elements situated downstream of the signal processing subsystem, and in particular of an amplification subsystem with low power level.

The objective of a signal power limiter is notably to satisfy the following specifications:

a first specification may be a resistance of the limiter to high received signal powers, for example between a few hundred milli-watts and a few hundred watts, and possibly up to a few kilowatts, and for one and the same limiter device;

a second specification may be a response time that is as short as possible, of the order of a nanosecond, in order to protect sensitive stages of the signal processing devices and do so from the rising edge of the incident power signal;

a third specification may be to have the lowest possible insertion losses, less than 1 dB for example, between a receiving antenna and a low noise amplification stage of the signal processing device;

a fourth specification may be an integration of the limiter in a small volume: this notably raises an issue of high dissipated power in a very small volume;

a fifth specification may be the possibility of dynamically adjusting the thresholds so as to be able to continue to use, as much as possible, attenuated and deformed signals that have passed through the structure of the limiter.

These major specifications may be complemented with a sixth specification, which is the possibility of performing radio-goniometric operations, such as locating the direction of an electromagnetic emission even in the presence of high power interference.

Current limiters are mainly based on a partial dissipation and a reflection of a portion of the incident signal by discrete semiconductor diodes, such as Schottky diodes or PIN diodes. The PIN diodes are PN junction diodes with intrinsic region. The Schottky diodes or PIN diodes are inserted at points located on a transmission line. The materials most commonly used for the diodes are, for example, silicon, gallium arsenide, or even gallium nitride.

Although very commonly used, the current limiters have a major drawback: their poor performance levels in the hyper frequency domain. In practice, the insertion losses of the current limiters are high, notably greater than 1 dB. Such insertion losses are not optimal for certain specific applications in which the signals are very low in amplitude. For low amplitude signals, it is essential to minimize the insertion losses, such as in radars for example. Furthermore, a signal distortion induced by the diodes used in the current limiters is a nuisance for applications that require their components to be greatly linear notably to avoid intermodulation phenomena between multiple signals.

Furthermore, the resistance of the current limiters in terms of received power is limited to a few tens of watts. Overheating induced by the passage of the current during incident signal power limiting phases may lead to destruction of the components situated downstream of a current limiter.

Other solutions based on superconductive lines also exist, but can be used only in environments cooled to very low temperatures. Such solutions are therefore difficult to integrate with other technologies.

Solutions based on ferroelectric and magnetic materials may be envisaged but cannot be fabricated inexpensively by collective methods. Furthermore, their performance levels in the hyper frequency domain and their power resistance over time remain uncertain.

Similarly, solutions based on ferrites or plasma lines have been published, and some are used in specific equipment, such as nuclear instrumentation for example, but, generally, they meet only one of the limiter specifications well, and meet the others unsatisfactorily.

The current solutions therefore do not meet the necessary specifications for a limiter.

SUMMARY OF THE INVENTION

One aim of the invention is notably to satisfy the above-mentioned major specifications.

To this end, one embodiment of the invention is a power limiter for an electromagnetic signal characterized in that it comprises at least:
  one transmission line for the signal, of a length that is a function of a wavelength of the signal, said transmission line comprising:
    a main transmission line for the signal;
    a first ground line;
    first passive micro-diodes with ballistic electron transport, said first micro-diodes being connected between the main transmission line and the first ground line, said first micro-diodes being distributed along the transmission line;
    a second ground line;
    second passive micro-diodes with ballistic electron transport, said second micro-diodes being connected between the main transmission line and the second ground line, said second micro-diodes being distributed along the transmission line;
  a cavity, comprising an environment that has a defined composition in terms of chemical species, at a defined pressure, in which the transmission line is placed.

The transmission line can be produced according to a coplanar technology.

A micro-diode comprises, for example, an anode and a cathode, and the anode is implemented by a first micro-tip.

According to one embodiment, a micro-diode comprising an anode and a cathode, the cathode is implemented by a second micro-tip.

The cathode is, for example, implemented by a third micro-tip of which an end opposite to a base of the micro-tip is truncated.

The anode can be implemented by a fourth micro-tip of which an end opposite to a base of the micro-tip is truncated.

The micro-diodes of the transmission line can be assembled according to a basic pattern comprising at least one micro-diode comprising an anode and a cathode comprising at least one of the aforementioned characteristics, said basic pattern being repeated along the transmission line.

The micro-diodes of the transmission line can be assembled according to a basic pattern comprising at least one micro-diode comprising an anode and a cathode according to at least one of the aforementioned characteristics, the basic pattern being repeated along the transmission line by inverting one in every two basic patterns with a symmetry of said basic pattern relative to a longitudinal axis of the transmission line.

The controlled environment can be a vacuum environment.

The controlled environment can comprise at least one inert gas.

The controlled environment can comprise at least one rare gas.

Another embodiment of the invention is a limiter structure comprising at least one substrate suitable for receiving a high-frequency electromagnetic signal. Said structure can comprise at least two substrate wafers. The two substrate wafers can encapsulate at least one cavity comprising a controlled atmospheric environment.

The electromagnetic signal can be transmitted to the power limiter through one of the substrates by reactive coupling.

The coupling can be a capacitive coupling.

The coupling can be an inductive coupling.

The cavity can be air-tight.

The wafers can be assembled by eutectic welding.

The wafers can be assembled by anodic welding.

The wafers can be assembled by thermocompression.

The cavity can comprise at least one port, external means then being able to be implemented to control the pressure and the composition in terms of gases in the cavity.

The structure can comprise a piezo electric material generating standing acoustic wave trains focussed on spaces between the micro-tips of the limiter.

The structure comprises a piezo electric material generating standing acoustic wave trains focussed on the micro-tips of the limiter.

The substrate can be transparent.

The structure can comprise at least one triggering electrode.

Another embodiment of the invention is a method of designing the distributed limiter comprising at least the following steps:
  definition of operating parameters of the power limiter;
  determination of equations for modelling the transmission line of the power limiter and of parameters of the modelling equations as a function of the operating parameters of the power limiter;
  definition of physical technologies for producing the power limiter and constraints associated with the defined technologies;
  definition of physical equations of the power limiter according to the implementation technologies;
  calculation of dimensioning parameters of the power limiter.

The step for definition of the operating parameters is, for example, a step for defining:
  an insertion loss of the limiter in linear operation;
  a total length of the transmission line of the limiter;
  an operating frequency band for the limiter;
  characteristic input and output impedances of the limiter;
  an input threshold power for the limiter above which the limiter dissipates the power of the signal;
  a maximum input power for the limiter;
  a maximum output power for the limiter;
  a maximum variation of the delay of the signal at the output of the limiter.

A transmission line consisting of a series of individual cells, said individual cells can be modelled by the following parameters:

an inductance L;
a capacitance C;
a first resistance R;
a second resistance Rv of the micro-diodes;
each modelling parameter of an individual cell can notably depend on a position x of the individual cell along the transmission line.

The first resistance R(x) can be almost zero.

A current I(x) circulating in an individual cell can be modelled by a first equation:

$$I(x) = \alpha(x)V(x) + \beta(x)V^3(x)$$

in which V(x) is, for example, an input voltage for the individual cell, $\alpha(x)$ is, for example, a first dissipation parameter, $\beta(x)$ is, for example, a second dissipation parameter;

The second resistance Rv(x) can be modelled by a second equation:

$$Rv(x) = \frac{1}{\alpha(x) + 3\beta(x)V^2(x)}$$

A third equation can model the propagation of the electromagnetic signal in the transmission line:

$$\frac{\partial^2 V(x,t)}{\partial x^2} - LC\frac{\partial^2 V(x,t)}{\partial t^2} - \alpha(x)L\frac{\partial V(x,t)}{\partial t} - 9\beta(x)LV^2\frac{\partial V(x,t)}{\partial t} = 0$$

A fifth equation can model the dissipation of the power along the transmission line by defining an average distribution in time of a dissipated power per unit length Pm(x):

$$\overline{Pm(x)} = \frac{1}{T} \cdot \int_0^T \frac{[V(x,t)]^2}{Rv(x,t)} \cdot dt = f(x)$$

in which $f(x)$ is a function to be chosen, T a time period. The form of $f(x)$ can be defined by a sixth equation:

$$f(x) = A \cdot \left(x - \frac{L_T}{2}\right)^2$$

in which A is an amplitude of the electromagnetic signal, and $L_T$ is the total length of the transmission line.

The inductance L, the capacitance C, the second resistance Rv can be calculated iteratively as a function of the operating parameters of the limiter and the form chosen for $f(x)$.

The parameters $\alpha(x)$, $\beta(x)$ can be determined by an identification of the parameters of the modelling equations for the individual cell with parameters of the physical equations of the limiter.

The parameters $\alpha(x)$, $\beta(x)$ depend notably on geometrical and physical characteristics of the micro-tips.

Features of an embodiment of the invention include:
that it allows a power limiter to be designed by precisely controlling its physical constitution in order to control the limiting characteristics of said limiter;
that it allows the limiter according to an embodiment of the invention to operate in degraded mode without limiting its performance levels;
that it provides for a wide band behaviour.

BRIEF DESCRIPTION OF THE FIGURES

Other features of the invention will become apparent from the following description, given as a nonlimiting illustration, and in light of the appended drawings which represent:
FIG. 2a: a schematic diagram of a distributed limiter according to the invention for an embodiment using a microstrip technology;
FIG. 2b: a schematic diagram of the distributed limiter according to the invention for an embodiment using a coplanar technology.

DETAILED DESCRIPTION OF THE INVENTION

Figure 1:
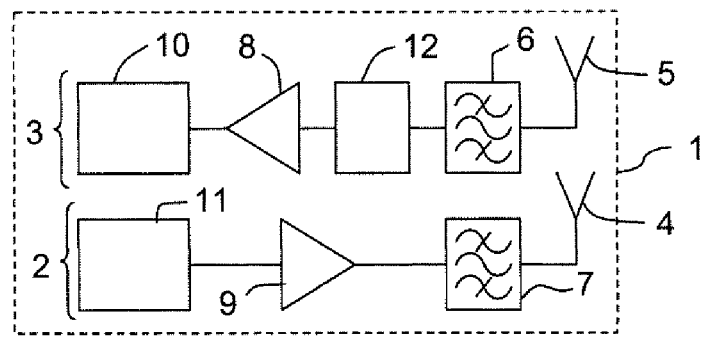
FIG. 1: a radiofrequency transmission subsystem.

FIG. 1 represents a known radiofrequency transmission subsystem 1. The radiofrequency transmission subsystem 1 notably comprises a first transmission subsystem 2 and a second reception subsystem 3. Each subsystem, transmission 2 or reception 3, comprises:
an antenna 4, 5;
a filter 6, 7;
an amplifier 8, 9.
The transmission subsystem 2 comprises a transmitter 11. The reception subsystem 3 comprises a receiver 10. A limiter 12 is, for example, placed on the reception subsystem 3 between a first filter 6 and a first amplifier 8. The limiter 12 can, in another embodiment, be placed between the antenna 5 and the first filter 6. The limiter 12, duly placed on the reception subsystem 3, can be used to avoid saturation or disabling, notably of the first amplifier 8 and of the receiver 10.

FIGS. 2a and 2b represent schematic diagrams of a distributed limiter 20.

FIG. 2a represents in particular a distributed limiter 20, suitable for an implementation using a microstrip technology. A microstrip technology uses a conductive strip on one face of which is placed a dielectric material and the other face of which forms a ground plane.

FIG. 2b represents a distributed limiter 20, suitable for an embodiment using a coplanar technology. The coplanar technology allows for the use of two ground planes separated by a conductive surface.

The distributed limiter 20 has a length $L_t$ corresponding to the length of a transmission line 25 forming part of the distributed limiter 20. The length $L_t$ is notably chosen so as to obtain a propagation of the signal along all the transmission line 25. For example, the length of the transmission line 25 may be of the order of the maximum wavelength of the signal to be propagated along the transmission line 25. The local value of the average power of the signal changes with the progression of the wave in the transmission line 25. Thus, a distributed limiter 20 can be represented as a series of several first individual cells 21, 22, 23, 24. Said individual cells exhibit a variability of geometrical parameters calculated so as to ensure a power distribution as desired, said variability depending on the position of the individual cell along the transmission line 25 and on the modulus of the voltage of the wave at the individual cell 21, 22, 23, 24. The first individual cells 21, 22, 23, 24 are mounted in series and thus form the transmission line 25. Each first individual cell 21, 22, 23, 24 notably comprises:

an inductance 211, 221, 231, 241, partly forming a first main line 26;
a first capacitor 212, 222, 232, 242, mounted in parallel in relation to the first main line 26, each first capacitor 212, 222, 232, 242 being linked to a ground potential 214, 224, 234, 244;
a first diode 213, 223, 233, 243 mounted in parallel with the first capacitor 212, 222, 232, 242;
a first optional resistor, not represented, placed in series with the inductor 211, 221, 231, 241.

The first individual cells 21, 22, 23, 24 are linked by the first main line 26, notably consisting of the inductors 211, 221, 231, 241, and a ground line 27 linking the first capacitors 212, 222, 232, 242 and the first diodes 213, 223, 233, 243 mounted in parallel.

FIG. 2b represents a distributed limiter 20 comprising a second ground line 270 symmetrical to the first ground line 27 in relation to the first main line 26. The distributed limiter 20 notably comprises second individual cells 210, 220, 230, 240 each comprising a first individual cell 21, 22, 23, 24 as represented in FIG. 2a and:

a second ground 216, 226, 236, 246;
a second capacitor 215, 225, 235, 245, mounted in parallel in relation to the first main line, each second capacitor 212, 222, 232, 242 being linked to the ground potential 214, 224, 234, 244;
a second diode 217, 227, 237, 247 mounted in parallel with the second capacitor 215, 225, 235, 245.

The optional first resistor can be used, by a judicious choice of its characteristics, to control the insertion losses of each first individual cell 21, 22, 23, 24, 210, 220, 230, 240. Preferentially, the value of the optional first resistor is chosen to be as low as possible. The minimum value to be given to the optional first resistor is given by the embodiment of the metallic layers implementing the limiter 20.

The diodes 213, 223, 233, 243, 217, 227, 237, 247 can be vacuum diodes or even gas-filled spark gaps. Hereinbelow, interest will be focussed in particular on vacuum diodes. Each diode 213, 223, 233, 243, 217, 227, 237, 247 can be implemented by a microstructure in the form of tips, or micro-tips. The transmission line 25 is then filled with the micro-tips. The micro-tips can be metallic, thus acting as passive diodes with nonlinear characteristics and with ballistic electron transport through the vacuum or in a gas. A diode 213, 223, 233, 243, 217, 227, 237, 247 is a nonlinear element that conducts when the power of the signal passing through it exceeds a certain threshold, that is to say when the induced electromagnetic field has a sufficiently high value. The power of a signal passing along the transmission line 25 is thus dissipated progressively by the micro-tips. Thus, each diode 213, 223, 233, 243, 217, 227, 237, 247 emits electrons to locally dissipate the power according to a desired dissipation law.

The incident signal can travel along the transmission line 25 equally from left to right or from right to left.

Such a structure of a transmission line 25 therefore advantageously comprises redundant power limiting elements: the individual cells 21, 22, 23, 24, 210, 220, 230, 240. This redundancy makes it possible to retain unaffected operation of the transmission line 25 even when a few individual cells 21, 22, 23, 24, 210, 220, 230, 240 are destroyed following excessively strong incident power pulses for example. Redundant cells 21, 22, 23, 24, 210, 220, 230, 240 can then take over.

Such a structure of a transmission line 25 therefore allows for a distribution of the power limiting function by dissipating the power over an integer number N of limiting elements distributed over a length $L_t$ of the transmission line 25. In FIGS. 2a, 2b, N is, for example, four. The distribution of the power limiting function makes it possible to reduce the constraints on the implementation of each individual cell 21, 22, 23, 24, 210, 220, 230, 240 by thus improving the overall resistance of the transmission line 25 to strong incident signal powers.

One advantage associated with the use of a coplanar embodiment of the limiter 20 is to have a symmetry in the transmission line 25 that allows for an effective distribution of the dissipation of the signal.

Figure 3:
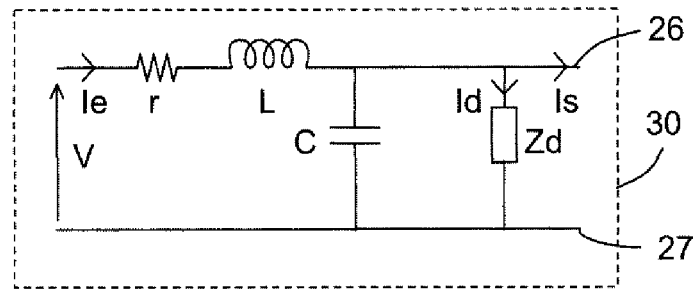
FIG. 3: an electromagnetic model of an individual cell of the distributed limiter.

FIG. 3 represents an electrical model 30 of an individual cell 21, 22, 23, 24, 210, 220, 230, 240 of the distributed limiter. The electrical model 30 can be applied to an individual cell of a transmission line 25 implemented using, for example, a coplanar, microstrip or similar technique. A voltage difference between the ground line 27, 270 and the first main line 26 is denoted V. A current $I_e$ enters into the transmission line 25 and a current $I_s$ leaves the transmission line 25. The first main line 26 comprises a resistor denoted R and an inductor denoted L. The resistor R models the losses of the transmission line 25. A capacitor C of the transmission line 25 represents the capacitor 212, 222, 232, 242, 215, 225, 235, 245. $Z_d$ denotes a dynamic impedance associated with a dissipative element: the diode 213, 223, 233, 243, 217, 227, 237, 247.

Figure 4:
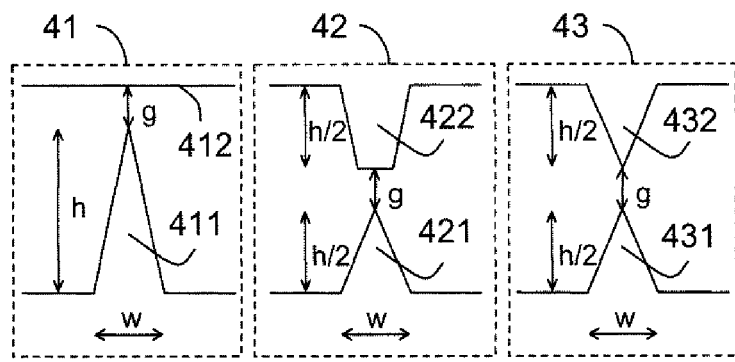
FIG. 4: several possible implementations of a diode of an individual cell of the distributed limiter.

FIG. 4 schematically represents a number of possible embodiments 41, 42, 43 of a diode 213, 223, 233, 243, 217, 227, 237, 247 of an individual cell 21, 22, 23, 24, 210, 220, 230, 240.

Each individual cell 21, 22, 23, 24, 210, 220, 230, 240, represented in FIG. 2, notably comprises a unitary dissipation element in the form of a diode 213, 223, 233, 243, 217, 227, 237, 247 located in a controlled composition environment. The environment may consist of a vacuum or a gas at controlled pressure. A diode can therefore be implemented by a microstructure comprising one or more tips 411, 421, 422, 431, 432. The tips can be truncated or not at their ends.

FIG. 3 is a two-dimensional representation of a number of possible embodiments 41, 42, 43 of a diode 213, 223, 233, 243, 217, 227, 237, 247. The diodes can be implemented in a metal wafer and can notably have a constant thickness. FIG. 4 represents a section of each diode 213, 223, 233, 243, 217, 227, 237, 247.

The shape and the geometrical dimensions of the diodes 213, 223, 233, 243, 217, 227, 237, 247 can be defined in such a way as to satisfy a number of requirements such as:
  a first requirement regarding distortion of the signal travelling through the structure of the distributed limiter 20;
  a second requirement concerning a power threshold of the signal from which the individual cell 21, 22, 23, 24, 210, 220, 230, 240 derives a portion of the power of the incident signal in order to dissipate it.

Each structure 41, 42, 43 of a diode has a different specific behaviour depending on the value and the polarity of the electromagnetic field generated in the diode upon the passage of the incident signal.

Each diode consists of two conducting electrodes: a first electrode 411, 421, 431 and a second electrode 412, 422, 432, separated by a gas or by the vacuum.

Each diode can notably be characterized by three dimensions:
  a first dimension g represents the gap between the first electrode 411, 421, 431 and the second electrode 412, 422, 432;
  a second dimension h represents the cumulative height of the first electrode 411, 421, 431 and the second electrode 412, 422, 432;
  a third dimension w represents the width of the first electrode 411, 421, 431 and the second electrode 412, 422, 432.

A first diode structure 41 can comprise a first tip 411 implementing, for example, a cathode, the anode being of planar form 412, perpendicular to the first tip 411. The first dimension g represents the gap between the end of the first tip 411 and the planar anode 412. The second dimension h represents, in this case, the height of the first tip 411. The third dimension w represents, in this case, the width of the base of the first tip 411.

The second diode structure 42 can comprise a second tip 421, the end of which faces a tip with its end truncated 422. The first dimension g represents the gap between the end of the second tip 421 and the end of the truncated tip 422. The second dimension h represents the sum of the height of the second tip 421 and the height of the truncated tip 422. The height of the second tip 421 and the height of the truncated tip 422 can be equal to h/2. The third dimension w represents the width of the base of the second tip 421 and of the base of the truncated tip 422 for example.

The third diode structure 43 can comprise two tip 431, 432 facing one another. The first dimension g represents the gap between the end of the third tip 431 and the end of the fourth tip 432. The second dimension h represents the sum of the height of the third tip 431 and the height of the fourth tip 432. The height of the third tip 431 and the height of the fourth tip 432 can be equal to h/2. The third dimension w represents the width of the base of the third tip 431 and of the base of the fourth tip 432 for example.

In the second structure 42 and in the third structure 43, the second tips 421 and the truncated tip 422, the third tip 431 and the fourth tip 432 can serve as the anode or the cathode depending on the polarity of the incident signal. To take a first example: if an incident signal of negative polarity arrives on the second tip 421, then said tip behaves as a cathode and emits electrons, the truncated tips 422 then behaves as an anode. To take a second example: if an incident signal of positive polarity arrives on the second tip 421, then said tip behaves as an anode, and the electrons are emitted by the truncated tip 422 which behaves, in this case, as a cathode. In the second example, the truncated tip 422 emits fewer electrons because of its geometry than the second tip 421 in the first example.

The second and third structures 42, 43 can therefore be used to process incident signals of different polarity. Furthermore, the second and third structures 42, 43 can advantageously be used to adjust the limiting function triggering thresholds as a function of the power of the incident signal, and do so by appropriately dimensioning the electrodes. By virtue of the second and third structures 42, 43, the incident signals can be processed in such a way as to obtain, at the output of the limiter, a stronger or weaker phase variation on the signal, depending on the change of power of the incident signal. Therefore, for a given power range, it is possible to vary the phase of the signal leaving the limiter more or less depending on the powers of the incident signal.

The dimensions w, h, g of the diodes can be defined as a function of hyper frequency constraints and of physical phenomena involved in the power limiting function.

A separation distance g between the two electrodes of the order of a micrometer or a submicronic separation distance makes it possible to obtain intense electromagnetic fields with low voltage values at the terminals of the electrodes. The choice of the geometrical structure used makes it possible to increase the values of the electromagnetic fields notably by using structures favouring so-called point effects.

FIGS. 5a, 5b, 5c, 5d, 5e represent a number of examples of implementation of a power limiter 20 and notably an assembly diagram of the diodes 213, 223, 233, 243, 217, 227, 237, 247 according to a coplanar technology.

The power limiter 20 is, for example, produced from a coplanar transmission line 50 such as the transmission line 25 represented in FIG. 2b. The coplanar transmission line 50 comprises a double distribution 51, 52 of diodes 53, 54, vacuum diodes for example. The two distributions 51, 52 extend either side of a second main line 55 such as the first main line 26 represented in FIG. 2b. Two ground planes 511, 512 are situated either side of the assembly consisting of the two distributions 51, 52 and of the second main line 55. The two ground planes 511, 512 correspond to the two ground lines 27, 270 represented in FIG. 2b. A diode assembly scheme may be characterized by a basic pattern 53, 54, 56, 57, 58 comprising one or more diodes.

FIGS. 5a, 5b, 5c, 5d, 5e show examples of a number of basic patterns 53, 54, 56, 57, 58 that can form a transmission line 50. Other examples of basic patterns may form a transmission line 25.

Figures 5A, 5B:
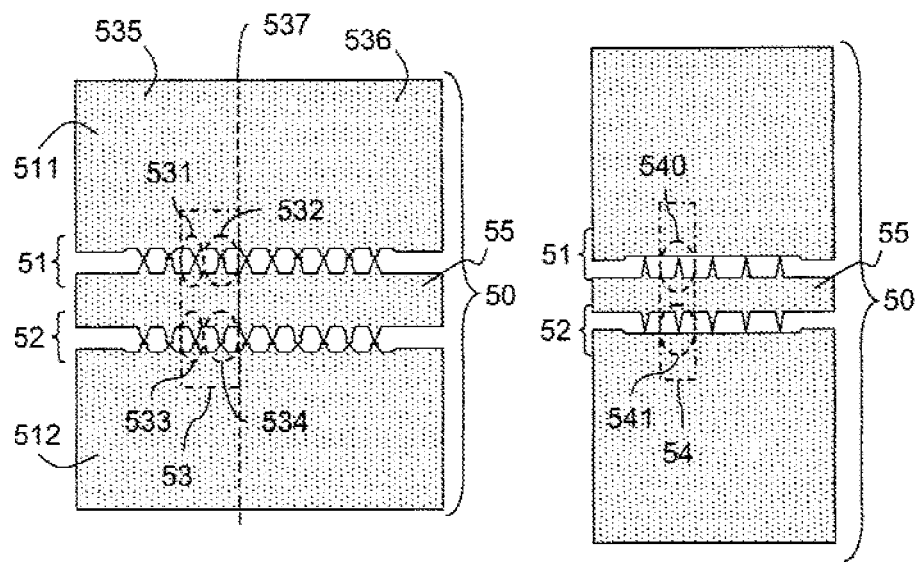
FIG. 5a: a first example of a basic pattern forming a transmission line of the distributed limiter.
FIG. 5b: a second example of a basic pattern forming a transmission line of the distributed limiter.

A first basic pattern 53 is represented in FIG. 5a. The first basic pattern 53 comprises two diodes 531, 532, 533, 534 on each distribution. The diodes 531, 532, 533, 534, that make up the first basic pattern 53, use the second structure 42 represented in FIG. 4. A first diode 531 of the first distribution 51 can be reversed relative to a second diode 532 of the first distribution 51. For example, in the first diode 531, the truncated tip 422 is located at the bottom whereas in the second diode 532, the truncated tip 422 is located at the top. A third diode 533 of the second distribution 52 can be reversed relative to the first diode 531 of the first distribution 51. For example, the truncated tip 422 of the third diode 533 is located at the top. A fourth diode 534 can be reversed relative to the third diode 533 and relative to the second diode 532. For example, the truncated tip 422 of the fourth diode 534 can be at the bottom as in FIG. 5a. The first basic pattern 53 can thus be repeated along the transmission line 50. It is also possible to produce a symmetry between the patterns of the two distributions 51, 52: for example, a first portion 535 of the transmission line 50 comprises a repetition of the first basic pattern 53 and a second portion 536 of the transmission line 50 can be obtained by a symmetry of the repetition of the first basic pattern 53 relative to a line of separation 537 between the first portion 535 and the second portion 536.

A second pattern 54 is represented in FIG. 5b. The second basic pattern comprises two diodes 540, 541 according to the first structure 41 represented in FIG. 4. The structure of a fifth diode 540 of the first distribution 51 can be reversed relative to the structure of a sixth diode 541 of the second distribution 52. For example, the tip 411 of the fifth diode 540 can be situated on the bottom portion of the first distribution 51 and the tip 411 of the sixth diode 541 can be situated on the top part of the second distribution 52.

Figures 5C, 5D:
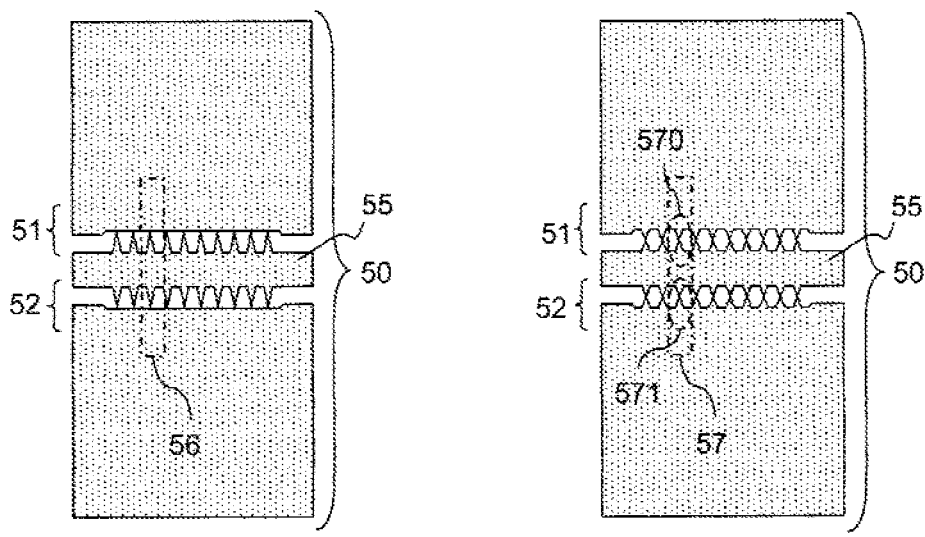
FIG. 5c: a third example of a basic pattern forming a transmission line of the distributed limiter.
FIG. 5d: a fourth example of a basic pattern forming a transmission line of the distributed limiter.

A third pattern 56 is represented in FIG. 5c. The third pattern 56 is identical to the second pattern 54. The distance between the successive patterns can be bigger as in FIG. 5b or smaller as in FIG. 5c.

A fourth pattern 57 is represented in FIG. 5d. The fourth pattern 57 comprises two diodes 570, 571 of the type of the third structure 43 represented in FIG. 4.

Figure 5E:
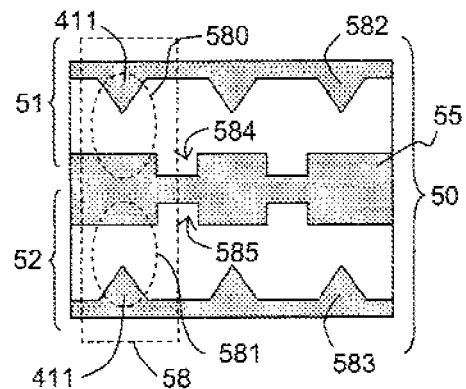
FIG. 5e: a fifth example of a basic pattern forming a transmission line of the distributed limiter.

A possible fifth pattern 58 is represented in FIG. 5e. The fifth pattern 58 comprises two diodes 580, 581 of the type of the first structure 41 represented in FIG. 4. A top portion 582 of the first distribution 51 comprises a tip 411 of a seventh diode 580, a bottom portion 583 of the second distribution 52 comprises a tip 411 of an eighth diode 581. The first main line 55, corresponding to a central portion between the two distributions 51, 52, comprises two notches 584, 585. The notches 584, 585 are situated in opposition and offset with the tip 411 of each diode 580, 581. Such a transmission line 50 is therefore of non-constant width. The notches 584, 585 are used notably to create a possible voltage drop in the event of the breakdown of one of the diodes 580, 581. A self-limiting of the currents in the tips 411 is thus obtained.

A distributed limiter can therefore be broken down into individual cells of the same electrical model 30 represented in FIG. 3. By varying the dimensioning parameters of the diodes and their structure, it is therefore possible to obtain various distributed limiter configurations, notably by alternating the basic patterns 53, 54, 56, 57, 58 asymmetrically.

The different variants in the shapes of transmission lines 50 make it possible to vary the capacitance and inductance parameters of the distributed limiter structure in order to allow greater freedom in the design choices for the limiter.

The power of the received signal is therefore dissipated progressively by the diodes along the transmission line 50 propagating the signal from diode to diode.

Figure 6:
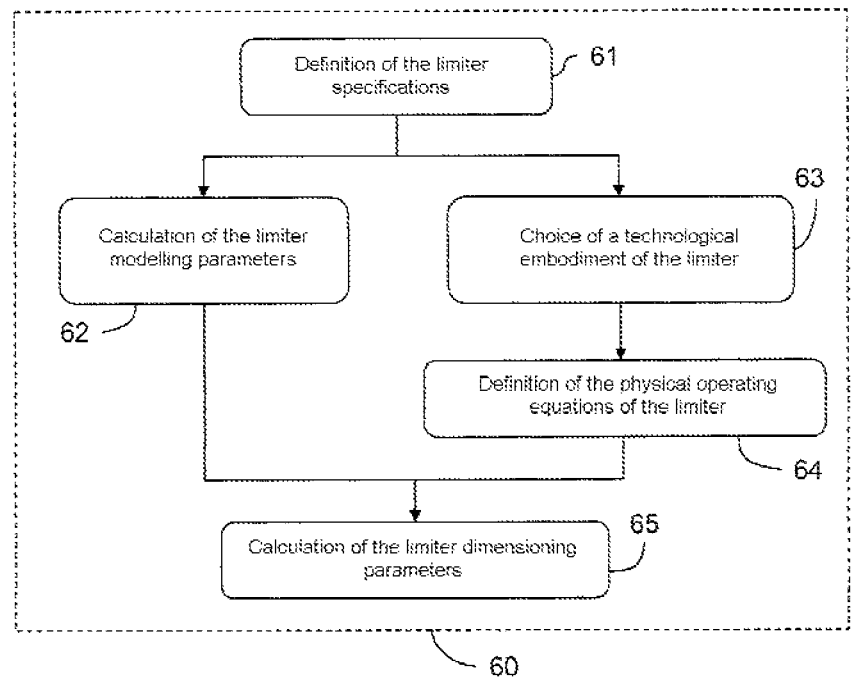
FIG. 6: several possible steps of a method of designing a distributed limiter.

FIG. 6 represents a method 60 for designing the distributed limiter 20. The method comprises a number of possible steps 61, 62, 63, 64, 65.

A first step 65 in the design of a distributed limiter 20 can be a step for defining specifications in terms of desired performance characteristics for the distributed limiter 20. This specification definition step is used to define operating parameters of the distributed limiter 20.

The operating parameters can be defined as described hereinbelow.

A first parameter is an insertion loss of the distributed limiter $P_{IL}$ in a case of linear operation of the limiter. Linear operation can be obtained when there are no non-linear effects due to the breakdown of the diodes in the distributor 20. The insertion loss is chosen, preferentially, to be as small as possible in the linear case. It should be noted that the insertion loss of the limiter is different from an insertion loss of the limiting device including the losses due to the technology used to implement the protective casing for the limiter 20.

A second parameter is the total length $L_t$ of the transmission line 50. It is over the length $L_t$ of the transmission line 50 that the greatest portion of the power of the incident signal is dissipated. It is then necessary for the residual power of the signal to be sufficient to be used at the output of the transmission line 50. The length of the transmission line 50 can be chosen as a function of the wavelength of the signal being propagated in the transmission line 50. Notably, $L_t$ can be chosen as follows: $L_t = \lambda/4$, with $\lambda$ being the wavelength of the signal being propagated so as to globally minimize the length of the transmission line 50. The duly calculated length $L_t$ advantageously makes it possible to obtain a distributed limiter 20 that occupies an insignificant surface area, while having a good propagation of the signal along the transmission line 50.

A third parameter is a useful frequency band $[F_{min}; F_{max}]$. The distributed limiter 20 operates within the limits of the useful frequency band. The performance characteristics of the distributed limiter 20 outside the useful frequency band are therefore of no interest.

A fourth parameter is a pair of characteristic impedances at the ports of the distributed limiter 20 when said limiter is operating in linear mode. A first impedance named, for example, $Z_{cin}$ is an impedance at the input of the distributed limiter 20. A second impedance named, for example, $Z_{cout}$ is an impedance at the output of the distributed limiter 20.

A fifth parameter is a threshold power $P_{cl}$ at the input of the distributed limiter from which the limiter device begins to limit, that is to say, to produce signals at the output of the limiter device with an amplitude that is less than the input amplitude.

A sixth parameter is a maximum power $P_{cmax}$ at the input of the distributed limiter 20, considered as the maximum power that the device can dissipate without being destroyed.

A seventh parameter is a maximum output power Pm of the distributed limiter 20. Pm is a maximum power observed by a device situated downstream of the distributed limiter 20 when the power at the input of the limiter is at the maximum power $P_{cmax}$. The device situated downstream is, for example, a filter or a low noise amplifier.

An eighth parameter is a maximum variation $\Delta\tau$ of a delay $\tau$ of the signal at the output of the limiter relative to the signal at the input of the limiter 20, when the power of the signal at the input of the limiter 20 changes from a value close to zero to a value close to $P_{cmax}$. The signal then belongs to the useful frequency band $[F_{min}; F_{max}]$.

A second step 62 may be a step for determining equations for a modelling of a transmission line 50 of a distributed limiter. From theoretical equations modelling the transmission line 50 and by using the parameters of specifications defined during the first step 61, the modelling parameters for the transmission line 50 can be determined.

Figure 7:
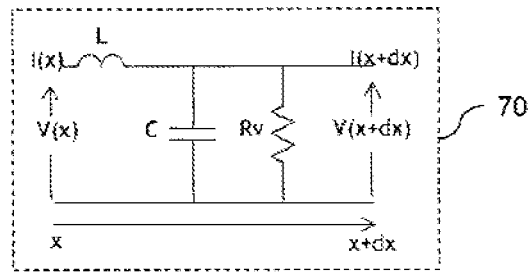
FIG. 7: a modelling of a reference cell of a transmission line of the distributed limiter.

FIG. 7 can be used to define modelling parameters for a reference cell 70 of the transmission line 50 of the distributed limiter 20. The distributed limiter can be likened to a series of unitary cells like the reference cell 70. If x is a position of the input of reference cell 70 on the transmission line 50, then x+dx is a position of the output of the reference cell 70 on the transmission line 50. The intensity of the current at the input I(x) of the reference cell 70 therefore depends on the position x. Similarly, the intensity of the current at the output of the reference cell 70 depends on the position of the output on the transmission line. I(x+dx) can therefore be used to denote the intensity of the output current of the reference cell 70. Similarly, the voltages at the input and at the output of the reference cell 70 depend on the position of the reference cell 70 on the transmission line 50. V(x) is therefore used to denote the input voltage of the reference cell 70 and V(x+dx) is used to denote the output voltage of the reference cell 70. Similarly, the inductance L and the capacitance C depend on the position x. Generally, a resistance per unit length R(x) can be added in series with the inductance L(x) as in FIG. 3. In a preferred embodiment, R(x) is chosen close to zero in order to have losses at the limiter that are as low as possible. The aim in fact is to have a limiter structure in which the loss in linear operation is as low as possible. The loss of the limiter is therefore given only by Rv(x), Rv(x) being a resistance associated with the dissipative element and notably with the tips 411, 421, 431, 422, 432 of a diode. Rv(x) is therefore a nonlinear variable resistance dependent locally on x. In practice Rv(x) is implemented by a micro-diode, for example one or more vacuum micro-diodes, characterized by the dynamic impedance $Z_d$ represented in FIG. 3.

The current in the resistance Rv(x) can be approximated by the following formula:

$$I(x) = \alpha(x)V(x) + \beta(x)V^3(x) \quad (1000)$$

This amounts to expressing Rv(x) in the form:

$$Rv(x) = \frac{1}{\alpha(x) + 3\beta(x)V^2(x)} \quad (1001)$$

The current law in the resistance Rv(x) (1000) is a polynomial comprising only the odd order terms in order for the signal leaving the limiter 20 to contain a smaller number of even harmonics. This provides for a better accuracy of measurement of the phase of the signal at the output of the limiter 20. In practice, the even harmonics reduce the accuracy of measurement of the phase of the signal.

In the formulae (1000) and (1001), the parameter $\alpha(x)$ is a parameter representing a dissipation in a case of linear operation of the limiter 20. A parameter $\alpha(x)$ that is as low as possible is desired.

In the formulae (1000) and (1001), the parameter $\beta(x)$ is a parameter representing a dissipation in a case of nonlinear operation of the limiter 20. The parameter $\beta(x)$ and the length $L_t$ of the transmission line 50 are linked by a complex relation involving both parameters of a thermal nature and parameters associated with the phase variation of the signals restored at the output of the limiter 20. For example, the higher $\beta(x)$ becomes, the greater the dissipation becomes. Moreover, the higher $\beta(x)$ becomes, the more it becomes necessary to increase the length $L_t$ of the transmission line 50 in order not to raise the temperature of the transmission line beyond a critical value of sublimation of the metallizations of the structure of the limiter 20. However, the longer the length $L_t$ of the transmission line 50 becomes, the greater the variation of the phase of the signal at the output of the limiter becomes. It is therefore necessary to make a choice in the design of the limiter according to the imposed specifications.

A fundamental equation for propagation of an electromagnetic signal in a series of cells of a transmission line 50, like the reference cell 70, may be:

$$\frac{\partial^2 V(x,t)}{\partial x^2} - LC\frac{\partial^2 V(x,t)}{\partial t^2} - \quad (1002)$$

-continued
$$\alpha(x)L\frac{\partial V(x,t)}{\partial t} - 9\beta(x)LV^2\frac{\partial V(x,t)}{\partial t} = 0$$

The equation (1002) is applicable regardless of the power of the incident signals at the input of the transmission line 50.

At any point of the transmission line 50, the characteristic impedance can be given by the following expression:

$$Zc(x) = \sqrt{\frac{L(x)}{C(x)}} \quad (1003)$$

The characteristic impedance Zc(x) can vary, for example, between $Z_{cin}$ and $Z_{cout}$ if $Z_{cin}$ is different from $Z_{cout}$. This variation of the characteristic impedance Zc(x) can be obtained in different ways and notably by using a "Klopfenstein taper" which is very compact. A "taper" is a line with continuously varying impedance.

The instantaneous current I(x,t) along the transmission line 50 can be given by the following formula:

$$I(x,t) = \frac{V(x,t)}{Z_c(x)} \quad (1004)$$

The instantaneous current $I_d(x,t)$ in a tip of a diode symbolized by Rv(x) is given by the formula:

$$I_d(x,t) = \frac{V(x,t)}{Rv(x,t)} \quad (1005)$$

Another equation concerning the controlled dissipation of the power all along the transmission line 50 can be applied. The dissipation in the structure can be controlled by defining an average distribution in time of the dissipated power per unit length Pm(x):

$$\overline{Pm(x)} = \frac{1}{T} \cdot \int_0^T \frac{[V(x,t)]^2}{Rv(x,t)} \cdot dt = f(x) \quad (1006)$$

In which T represents a time period of the incident signal.

For example, if a constant dissipation is desired along the transmission line, a constant function $f(x)$ can be taken.

It is possible, thereafter, with the formula for dissipated power per unit length Pm(x) (1006), to calculate, for each configuration [L(x), C(x), Rv(x)] of the transmission line 50, the dissipated power Pm(x). Then, by using an iterative procedure for example, a configuration [L(x), C(x), Rv(x)] can be found that gives $f(x)$ a desired form. A configuration [L(x), C(x), Rv(x)] can also be found that produces a maximum variation Δτ of the delay τ for the entire range of useful frequencies [$F_{min}$;$F_{max}$] and the entire range of powers of the incident signal at the input of the limiter up to the maximum power $P_{cmax}$. It is possible, for example, to scan the entire range of useful frequencies and the entire range of powers of the incident signal at the input of the limiter in order to determine a set of configurations [L(x), C(x), Rv(x)] and, from this set of configurations, the one that minimizes Δτ is chosen. To obtain the set of configurations [L(x), C(x), Rv(x)] the transmission line 50 can, for example, be modelled. Then, based on the modelling and on the previously defined operating parameters of the distributed limiter, a digital simulation can be used to obtain the different configurations that minimize Δτ. It is, for example, possible to use genetic algorithms converging towards a configuration that minimizes Δτ.

In practice, it should be noted that if $f(x)$ is constant and if $Zc(x)$ is also constant, then the distribution of the temperature $Tp(x)$ along the transmission line 50 is of parabolic form with a maximum that takes the value $Tp_{max}$ for a value of $x=L/2$, corresponding to the middle of the propagation line or transmission line 50. The temperatures at the input and at the output of the propagation line 50 are a little greater than the ambient temperature. There is therefore a risk that $Tp_{max}$ might exceed a critical value beyond which there is sublimation of the material forming the limiter 20, or even possible destruction of the tips 411, 421, 431, 422, 432. This is why, if the desire is to optimize the structure of the distributed limiter 20, and in particular when a continuous flow of power arrives at the input of the structure of the distributed limiter 20, a form of the following type is, for example, chosen for $f(x)$:

$$f(x) = A \cdot \left(x - \frac{L_T}{2}\right)^2 \tag{1007}$$

In which A is a factor proportional to the power of the signal travelling through the structure of the distributed limiter 20.

The form (1007) of $f(x)$ makes it possible to obtain a power distribution along the transmission line 50 that notably results in a constant temperature along the transmission line 50.

To design a distributed limiter 20, there is therefore a set of constituent equations for the operation of the distributed limiter such as the equations (1001) to (1007). The constituent equations for the distributed limiter 20 liken the distributed limiter to a propagation line defined by a distribution per unit length of the modelling parameters of the reference cell 70 [L(x), C(x), Rv(x,V(t))] (1008), regardless of the production technology employed. In the distribution per unit length (1008), the variable resistance Rv depends on the instantaneous variation of the voltage V(t) of the signal to be processed.

During the first step 65 in the design of a distributed limiter 20, the operating specifications of the distributed limiter 20 are defined. The defined specifications can then be introduced into the constituent equations for operation of the distributed limiter 20. The specifications, or operating parameters, can be introduced into the constituent equations in a number of ways:

either as limiting conditions in the differential equations (1002), (1006), such as $Z_{cin}$ and $Z_{cout}$ at the inputs, outputs of the transmission line 50 for the equation (1002), or even $P_{cmax}$ for the equation (1006);

or as the expected result of the differential equations (1002), (1006), such as Pm when there is $P_{cmax}$ at the input of the distributed limiter 20 for the equation (1006).

Since the constituent equations for the distributed limiter 20 are nonlinear, and therefore cannot be solved by analytical methods, efforts are therefore made to solve them by digital calculation methods that are also known. Solving the constituent equations for the distributed limiter 20 is a way of determining the distribution per unit length [L(x), C(x), Rv(x, V(t))] of the geometrical parameters of the structure of the distributed limiter 20.

A third step 63 in the design of a distributed limiter 20 may be a step for choosing a technology for producing the distributed limiter 20. For example, a designer of the distributed limiter 20 may choose a type of coplanar transmission line that uses a silicon process of a particular depth or a hollow metal waveguide technology. Each technological method has its own constraints, notably in terms of geometry and the materials that can be used.

Geometrical constraints may be:
  maximum and minimum dimensions of the geometrical patterns that can be produced as a function of a maximum height of a substrate used, of a resolution of metallic lines; the maximum dimensions of the geometrical patterns are notably useful in order to define the geometries of the tips 411, 421, 431, 422, 432 of the diodes represented in FIG. 4.
  forms of tips 411, 421, 431, 422, 432 that can be produced according to a selected technological production method.

Other technological production constraints may be taken into account such as:
  types of materials used: conductors and dielectrics;
  a symmetry of the electrodes of the diodes in order to obtain an optimum processing of the phase of the signal if necessary;
  the presence or absence of a gas in the structure of the limiter 20 and a type of gas to be used: a decision criterion may be a specific range of powers to be processed;
  constraints associated with the materials used, such as a maximum temperature of the metal chosen before the sublimation step.

The technological choices made notably condition the form of the physical operating equations of a tip in its environment.

A fourth step 64 is therefore a step of defining the physical operating equations of a distributed limiter 20. A physical operating equation of a tip of a distributed limiter 20 may be, for example, a formula linking the instantaneous current in the tip, denoted $I_p$, with the instantaneous voltage V(t) at the terminals of the tip:

$$I_p(V) = \alpha V(t) + \beta V^3(t) + \gamma V^5(t) + \ldots \tag{1009}$$

$I_p$ is notably defined according to the physical equations of the distributed limiter, dependent on the type of technologies employed. Various physical laws can be implemented such as the Fowler-Nordheim, Richardson-Dushman laws. The rest of the fourth step 64 is applied in the same way for the different physical laws.

The parameters $\alpha$, $\beta$, $\gamma$, of the equation (1009) are directly linked to the geometrical and physical characteristics of the tips of the limiter 20, such as the work functions $W_M$ of the materials forming the tips, a form F, and a distance $\delta$ between a tip of each electrode and the line facing the distributed limiter 20. The distance $\delta$ depends on the position of the electrode along the transmission line (25).

For example, the following expressions can be used:

$$\alpha = f(W_M, F, \delta) \tag{1010}$$

$$\beta = f(W_M, F, \delta) \tag{1011}$$

$$\gamma = f(W_M, F, \delta) \tag{1012}$$

The work functions $W_M$ of the materials represent the energy supplied by the signal entering into the metal forming the tips to cause electrons to pass from the metal into the vacuum for example. The form F corresponds, for example, to a more or less rounded form of the tips that can be characterized by two radii of curvature r and r' and a thickness e. The two radii of curvature r and r' can be a first radius of curvature r perpendicular to the plane of the transmission line 50 and a second radius of curvature r' parallel to the plane of the transmission line 50. The first radius of curvature r can notably depend on the thickness e of the tips.

The formula (1009) expressing $I_p(V)$ can be represented in the following form:

$$\frac{dI_p(V)}{dV} = \alpha + \beta V^2(t) + \gamma V^4(t) + \ldots = G_P(V) = \frac{1}{R_V} \quad (1013)$$

The equation (1013) defines the conductance $G_p(V)$ of the distributed limiter 20.

If we take the example of a distributed limiter 20 produced in a vacuum with no thermal heating of the electrodes, in this case, the Fowler-Nordheim law is applied to an emission of electrodes by the diodes of the limiter 20. A relation linking the current $I_d$ in a diode and the voltage V in the diode is then:

$$I_d(V) = a\frac{r^2}{\delta^2}\frac{V^2}{W_M}\exp\left(-\frac{\delta}{r}\frac{bW_M^{3/2}}{V}\right) \quad \text{for } V > 0 \quad (1014)$$

$$I_d(V) = 0 \quad \text{for } V \leq 0$$

in which a and b are two so-called Fowler-Nordheim constants, r is a field amplification factor linked to the radius of curvature of the electrodes, and δ is the distance between electrodes.

By performing a limited development of the relation (1014), we obtain, for V>0:

$$I_d(V) = a\frac{r^2}{\delta^2}\frac{V^2}{W_M} + ab\frac{\delta}{r}W_M^{3/2}V \quad (1015)$$

This relation is true for V>0 in the case of an asymmetrical diode with $I_d(V)=0$ for $V \leq 0$.

By combining two asymmetrical diodes in an anti-parallel manner or by using a symmetrical diode, it is possible to obtain a characteristic that has an odd function $I_d(V)$ defined for V>0 and V≦0. The current equation (1015) then becomes:

$$I_d(V) = a\frac{r^2}{\delta^2}\frac{1}{W_M}\frac{V^3}{|V|} + ab\frac{\delta}{r}W_M^{3/2}V \quad (1016)$$

The expression (1016) is an odd function, the general form of which is close to a cubic function. By comparing $I_d(V)$ to $I_p(V)$ we obtain:

$$a\frac{r^2}{\delta^2}\frac{1}{W_M}\frac{V^3}{|V|} + ab\frac{\delta}{r}W_M^{3/2}V = \alpha V(t) + \beta V^3(t) + \gamma V^5(t) + \ldots \quad (1017)$$

By approximation and digital calculation methods, it is then possible to identify the coefficients α, β, γ, associated with the study of the distributed limiter system 20 and with the different coefficients r, d, $W_M$ of the equation (1016). It is therefore possible to deduce therefrom digital values of the geometrical parameters of each individual cell 21, 22, 23, 24, 210, 220, 230, 240 represented in FIGS. 2a, 2b.

The procedure is the same for other physical laws.

A fifth step 65 is a step for calculating geometrical dimensioning parameters of the distributed limiter 20. From the physical operating equations of the tips of the limiter 20, and from the results obtained by solving the constituent equations of the distributed limiter 20, it is possible to determine notably two types of parameters defining a structure of the limiter 20 to be fabricated.

A first type of parameter for defining the structure of the limiter 20 combines parameters describing the geometry of the limiter, including, notably:

characteristics of the transmission line 25, such as a width, a height;
a periodicity of the diode tips on a transmission line 25;
characteristics defining the form of the tips;
a gap between the tips of a diode.

A second type of parameters may notably include the following parameters:

pressure of the gas injected into the structure of the limiter 20, notably between the electrodes of the limiter 20, the pressure of the gas is then uniform;
parameters for dynamically adjusting power limiting thresholds according to a chosen dynamic adjustment method and linked to a physical implementation of the limiter 20 as described later in the document.

Determining the parameters defining the structure of the limiter 20 notably involves identifying, term by term, the parameters of the development $G_p(V)$ for a tip i, i being an integer varying from 1 to N for example, N being the total number of tips of the distributed limiter 20. This is done in order to obtain an expression $G(x,V(t))$ for the conductance as a function of x and of V(t). $G_p(i,V)$ is therefore used to denote the conductance $G_p(V)$ for a tip i. The first step is to switch from a continuous expression of $G_p(V)$ to a discrete expression $G_p(i,V)$ by defining a number N of tips to be distributed over the structure of the distributed limiter 20. N can be determined in a number of ways:

A first method uses the results obtained during the second step 62 from the solving of the constituent differential equations of the distributed limiter 20. These results can be used notably to obtain a distribution at any point of position x of the limiter 20 of the values of the signals in intensity I(x,t) and in voltage V(x,t). Also, for a tip of a given form or structure, there is a maximum current $I_{pmax}$ that must not be exceeded. In practice, for the current $I_{pmax}$, the temperature of the tip reaches a critical value $T_{pmax}$ beyond which the tip may be destroyed. If p is one pitch, that is to say a spatial period that is, for example, constant, of the distribution of the tips, the following can be written:

$$I_{pmax}(V) \approx I(x,V) \times p \quad (1017)$$

I(x,V) is obtained for a chosen length $L_t$ of the transmission line 50. If the spatial period p is chosen to be constant, by knowing the distribution of I over the entire length of the transmission line 50, it is possible to check that the parameterizing of the radius of curvature of the tips or the separation between electrodes satisfies the relation (1017) all along the transmission line 50. In which case, p can be defined as follows:

$$p = I_{pmax}(V)/\text{Max}(I(x,V(t))) \quad (1018)$$

Knowing the length Lo of the transmission line that can be used to perform the limiting function, with $Lo \leq L_T$, the following then applies:

$$N \approx Lo/p \quad (1019)$$

A second method is as follows: a thermal simulation can be conducted to ascertain a maximum pitch $p_{max}$ between two consecutive tips of the transmission line 50. It is then possible, in the same way as previously, to deduce therefrom a value of N.

A third method uses an electromagnetic analysis of the geometrical structure of the transmission line 50. The electromagnetic analysis defines a spatial period p between the tips of the limiter 20 such that each tip can be considered, from the point of view of its own operation, to be independent of the neighbouring tips. In this way, it is possible to calculate a value of N.
Other methods may use a variable spatial period p. For example: when N is determined with a constant pitch p and the performance levels of the limiter are unsatisfactory, it is then possible to introduce a variability of the pitch p. The variability of the pitch p can then be used in the context of optimizing the distribution of the temperature and the minimum variation of the phase of the signal at the output of the limiter or the delay τ.

Once the number of tips N is obtained, it is then possible to complete the dimensioning of the limiter 20 by taking the distribution I(x, V) integrated over each segment of index i and of length p, of the transmission line 50 in order to determine the following quantity:

$$\int_{segment\ i} \frac{I(x, V)}{V(x)} = G_p(x, V(t)) \quad (1020)$$

It is thus possible to obtain the parameters α, β, γ for each segment of index i. The parameters α, β, γ are then used to obtain the parameters M, F, δ.

The duly obtained parameters are then used to format the distributed limiter 20, notably by dimensioning the lithography masks, the mechanical drawings used to fabricate the distributed limiter 20.

FIGS. 8a, 8b, 8c, 8d, 8e, 8f represent, schematically and two-dimensionally, a first example of implementation of a structure 801 comprising the distributed limiter 20.

Figure 8A:
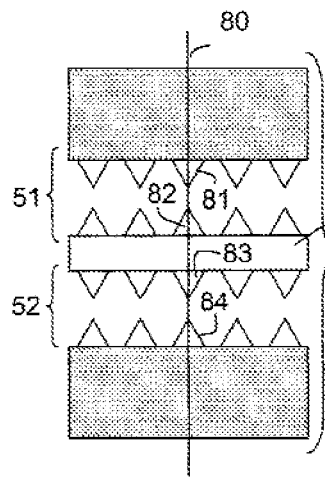
FIG. 8a: a transmission line of the distributed limiter.
Figure 8B:
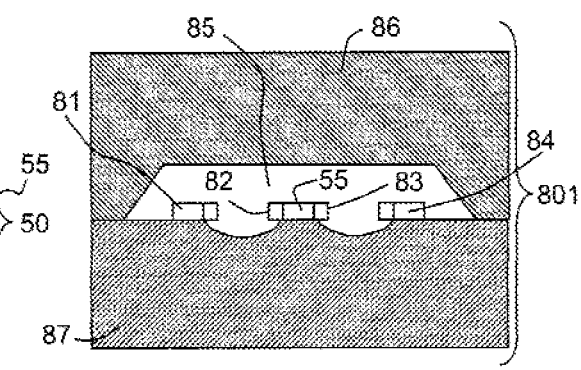
FIG. 8b: a first cross-sectional view of a first embodiment of the transmission line according to a first axis.

FIG. 8a represents a transmission line 50, as represented in FIG. 5a and seen from above. FIG. 8b represents a first cross-sectional view of the transmission line 50 along a first axis 80. The first axis 80 is perpendicular to the second main line 55 and passes through four points 81, 82, 83, 84 that are aligned and divided into two by the first axis 80.

The dissipative structures of the limiter 20 consist only of metal. This makes it possible to employ very simple and reliable fabrication methods. The limiters 20 are, for example, fabricated by using techniques deriving from microelectronics and microsystems on any type of substrate suited to high frequencies such as gallium arsenide, gallium nitride, high resistivity silicon.

A distributed limiter 20 in two dimensions can be produced according to various steps of a production method:
 a first production step may be a step for cleaning a substrate wafer;
 a second production step may be a step of deposition of an optional insulator on the substrate;
 a third production step may be a step for metal deposition in order, notably, to produce the electrodes on the substrate;
 a fourth production step may be a step of photolithography of the patterns of the electrodes based on a mask;
 a fifth production step may be a step for etching the metal deposited during the third step;
 a sixth production step may be an optional oxide etching step;
 a seventh production step may be a step for localized etching of the substrate;
 an eighth production step may be a final step for cleaning the components of the limiter 20 produced in this way in a first wafer.

The components of the limiter 20 are, notably, the tips 81, 82, 83, 84, the ground planes 511, 512, the second main line 55. The components can then be encapsulated in a controlled environment. This makes it possible to ensure a good life span for the components of the distributed limiter 20 and performance characteristics that are stable over time. The components of the limiter 20 can be encapsulated for example:
 in a vacuum;
 in an inert gas such as nitrogen, hydrogen;
 in a rare gas such as helium, neon, argon.

The encapsulation in a controlled environment of the components of the limiter 20 also makes it possible to be able to control the power dissipation triggering thresholds.

The components of the limiter 20 can therefore be protected in at least one airtight or sealed cavity 85, the environment of which is controlled during a ninth production step: the encapsulation step. During the encapsulation step, two substrates 86, 87 can be assembled on the wafers in order to form the cavity 85 in a sealed or airtight manner, thus forming a structure 801 of the limiter.

The use of a transparent substrate 86, 87 may make it possible to optically control any degradations of the components of the limiter 20 and detect electric arcs that might damage the components.

A first substrate 86 is that of the first wafer produced. A second substrate 87 corresponds to a second, previously machined wafer. The second substrate 87 supports notably the tips 81, 82, 83, 84 of the limiter 20 and the second main line 55. A localized etching of the second substrate 87 under the tips 81, 82, 83, 84 of the electrodes of the limiter 20 makes it possible to free the ends of the tips 81, 82, 83, 84 and also facilitates the extraction of electrons while avoiding electrical breakdowns in the second substrate 87. The two substrates 86, 87 can then be assembled by various methods, for example:
 eutectic welding;
 anodic welding;
 thermocompression;
 direct welding;
 glue, polymer.
Preferentially, eutectic and anodic welds and thermocompression are used in order to obtain an airtight assembly.

The physio-chemical environment of the components of the limiter 20 is therefore defined during the encapsulation step. The pressure and the chemical species of the environment can be controlled in a welding rack. A welding rack may be a vacuum or neutral gas-filled chamber used to produce welds without oxygen. A welding rack is used notably to introduce into the cavity 85 chemical species of previously defined composition. A welding rack can also be used to control a pressure prevailing inside the cavity 85 by creating a defined pressure in the cavity 85. The defined chemical species are first introduced into the welding rack. Then, the pressure is imposed inside the welding rack. Once a physico-chemical balance has been obtained in the welding rack, the substrates are welded, thus ensuring that the physico-chemical environment of the cavity 85 matches the environment created in the welding rack. The welding rack can also be used to create a vacuum in the cavity 85. The pressure and gas parameters possibly present inside the cavity 85 can be used to control a triggering threshold and a possible formation of electric arcs.

Figure 8C:
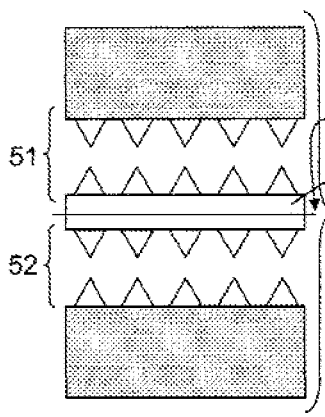
FIG. 8c: a transmission line of the distributed limiter.
Figure 8D:
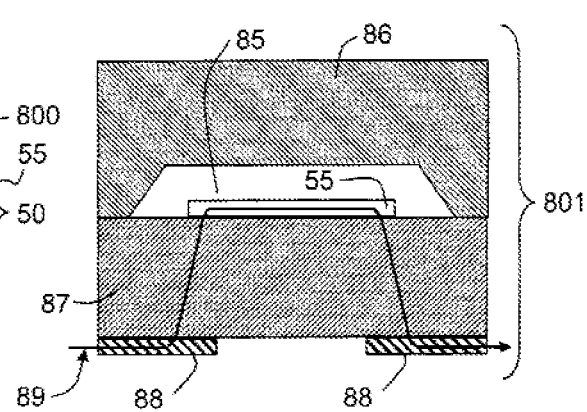
FIG. 8d: a second cross-sectional view, along a second axis, of the first embodiment of the transmission line.

FIG. 8c represents a transmission line 50 as represented in FIG. 5a. FIG. 8d represents a second cross-sectional view of the transmission line 50 along a second axis 800. The second axis 800 is notably parallel to the second main line 55 and divides it into two for example.

The transmission of a signal 89 received by the limiter can be performed from metallic conductors 88 towards the second main line 55 by a reactive coupling through the second substrate 87 for example.

Figure 8E:
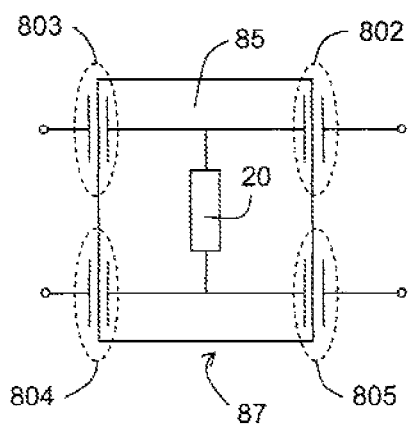
FIG. 8e: a capacitive coupling implemented in a structure of the distributed limiter.
Figure 8F:
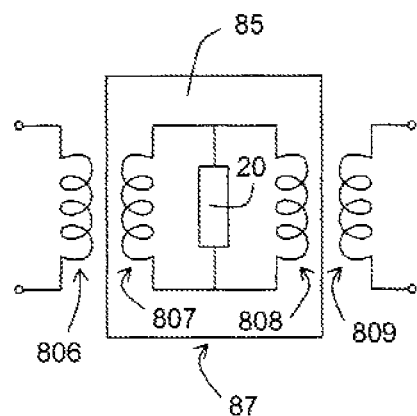
FIG. 8f: an inductive coupling implemented in a structure of the distributed limiter.

FIGS. 8e and 8f represent two reactive coupling wiring diagrams. The distributed limiter 20 is represented schematically inside the cavity 85.

FIG. 8e shows a capacitive coupling represented by four capacitors 802, 803, 804, 805 for example. Each capacitor 802, 803, 804, 805 comprises, for example, two metallic plates facing the second substrate 87. A first metallic plate of each capacitor is situated inside the cavity 85 and linked with the distributed limiter 20. A second metallic plate of each capacitor 802, 803, 804, 805 is, for example, linked to inputs/outputs of the signal 89 in the structure 801 of the distributed limiter 20. The values of the capacitors 802, 803, 804, 805 are a function of the surface area of the metallic plates and of the thickness and the permittivity of the second substrate 87. The thinner the second substrate 87 becomes and/or the higher the relative permittivity of the second substrate 87 becomes, the higher the value of the coupling capacitor 802, 803, 804, 805 may be, and this for one and the same reactive coupling geometry.

FIG. 8f represents an inductive coupling produced, for example, by four inductors 806, 807, 808, 809. Two first inductors 806, 809 are linked to the inputs/outputs of the signal 89 in the structure 801. Two second inductors 807, 808 are situated inside the cavity 85 and linked to the distributed limiter 20. The first inductors 806, 809 are placed facing the two second inductors 807, 808, on two faces of the second substrate 87. When one of the inductors 806, 807, 808, 809 generates a magnetic field during the passage of the received signal 89, the inductor situated opposite reproduces the signal 89 from the generated magnetic field. The coupling of the inductors 806, 807, 808, 809 facing one another depends on the distance between them, that is to say on the thickness of the second substrate 87, but also on the diameter of the coils of the inductors 806, 807, 808, 809 which also determines the value of their inductance.

The capacitive or inductive coupling techniques can be used, through the second substrate 87 of the structure 801, to supply the limiter 20 with a signal 89, for example a hyperfrequency signal, by guaranteeing an air-tightness of the structure 801 since the integrity of the encapsulation is assured.

The hyperfrequency performance characteristics of the coupling structures make it possible to supply the limiter 20 with very low insertion losses with high passband widths. Increasing the passband widths is also possible by optimizing the coupling structures at the ports, by, for example, implementing "taper" structures instead of the capacitors 802, 803, 804, 805 and inductors 806, 807, 808, 809 respectively represented in FIGS. 8e and 8f. Such "taper" structures reduce the impedance breaks associated with abrupt changes of geometries, so making it possible to obtain ultra-wideband structures.

It is possible to adjust the performance characteristics of the electromagnetic coupling structures when manufacturing the components of the limiter 20 according to the planned applications of the limiter without modifying the dimensions of the structure 801. Thus, by modifying parameters such as the thickness of the substrates 86, 87 when manufacturing the structure 801, it is possible to obtain frequencies at the centre of the limiter 20 and bandwidths that can be adjusted on demand. For example, it is possible to thin the second substrate 87 after assembly and before the face of the substrate external to the cavity 85 is metallized.

The structure 801 of the limiter 20 can advantageously be a monolithic structure.

Figure 9:
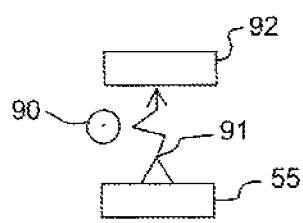
FIG. 9: a triggering electrode.

FIG. 9 shows a solution for dynamically adjusting the power limiting thresholds of the limiter 20 without changing the mechanical structure 801 of the limiter. The solution is to add one or more electrodes 90 for triggering or pre-ionizing the environment of the diodes of the limiter 20. In FIG. 9, a triggering electrode 90 is perpendicular to an anode 91 in relation to a cathode 92. The triggering electrode 90 can be a tip directed almost parallel to the second main line 55.

The triggering electrode 90 is used notably to modify a breakdown threshold for the electrode 91, 92.

Figure 10:
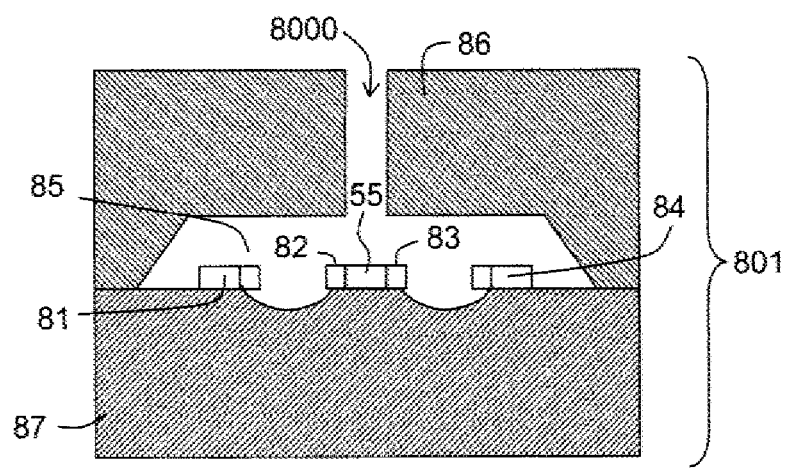
FIG. 10: a cross-sectional view, along the first axis, of a second embodiment of the transmission line.

FIG. 10 represents a second solution for dynamically adjusting the limiting thresholds. FIG. 10 shows a third cross-sectional view of a transmission line 50 along the first axis 80 as represented in FIG. 8a. One or more gas ports 8000 can be incorporated in the structure 801, making it possible to control, from outside, the pressure and the composition of the environment of the cavity 85 of the structure 801. The ports 8000 can be produced by using, for example, micro-fluidic systems. The triggering threshold powers of the limiter 20 can thus be adjusted by modifying the chemical environment of the diodes of the limiter 20. For example, a combination of different gases at different concentrations and pressures can be used to modify the dielectric strength of the limiter 20 and therefore the limiting thresholds.

Figure 11:
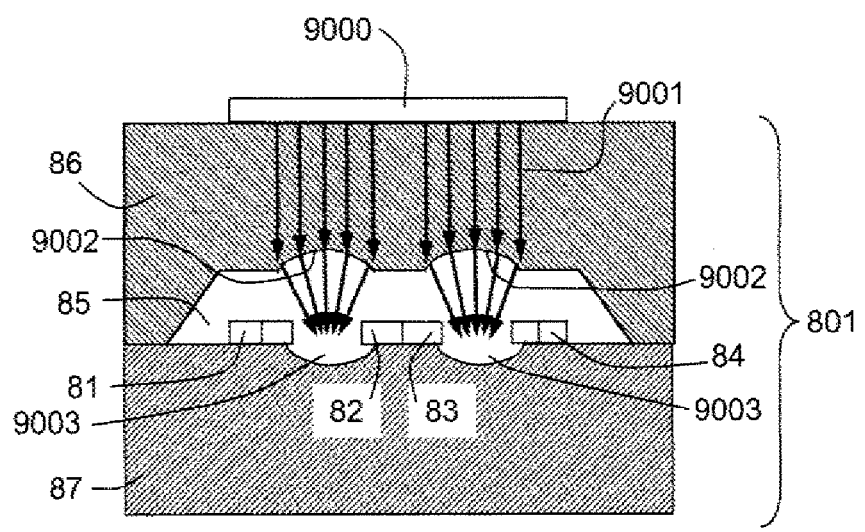
FIG. 11: a cross-sectional view, along the first axis, of a third embodiment of the transmission line.

FIG. 11 shows a third solution for dynamically adjusting the limiting thresholds. FIG. 11 shows a fourth cross-sectional view of the transmission line 50 along the first axis 80 as represented in FIG. 8a. The structure 801 can comprise, on a top face, cooperating with the first substrate 86, a piezoelectric material 9000. The piezoelectric material 9000 is used to generate an energy 9001. The energy 9001 is then focussed by means of one or more focussing lenses 9002 produced in the first substrate 86 and positioned on the path of the energy 9001. The energy 9001 can be focussed in inter-electrode regions 9003 of the limiter 20. The energy focussed in the inter-electrode regions 9003 is then reflected on the surface of the second substrate 87, thus creating a pressurization or a depressurization for example in the inter-electrode regions 9003. The pressurization or depressurization depends notably on the shape of the inter-electrode region 9003 and more specifically on the shape of the surface area of the second substrate 87 in the inter-electrode regions 9003. The reflection of the energy 9001 may provoke standing acoustic waves, notably in the cavity 85 and in the first substrate 86.

The local pressurizations or depressurizations generated inside the cavity 85 can modify the operation of the components of the limiter 20. For example, the standing acoustic waves can be used to adjust the limiting thresholds dependent on the pressure conditions inside the cavity 85. In practice, when the pressure becomes greater or lesser inside the cavity 85, the breakdown voltages of the diodes of the limiter 20 are modified. A top portion of the second substrate 87 can be chemically machined in order to serve as a focussing lens for the acoustic waves.

Another solution of the same type as the third solution can also be implemented: it is possible, for example, to use an optical signal originating, for example, from an optical fibre and focus it in two different ways:
 a first focussing possibility may be a focussing of the optical signal on the inter-electrode spaces in order to facilitate an avalanche triggering of the breakdown of the diodes in case of presence of a gas or a gaseous mixture in the cavity 85 a second focussing possibility may be a focussing on an electrode of the limiter 20 in order to heat it and thus reduce the threshold of electron emission by the electrode.

The powers involved in this other solution are relatively low, of the order of a few tens of milliwatts. The optical power can also be easily adjustable. The substrates used in the context of this solution are sufficiently transparent to the optical signals.

The various methods employed in the fabrication of the structure 801 of the limiter 20 enable the limiter 20 to be easily integrated with functions such as:

- an impedance matching array;
- a tunable or switchable filter;
- silicon or silicon germanium amplifiers;
- an antenna;
- other functions that can be produced in RF-MEMS technology (RF-MEMS being an acronym for Radio Frequency Micro Electro-Mechanical System).

The monolithic integration of all these functions then makes it possible to obtain highly integrated components at low cost.

One advantage of the limiter 20 according to an embodiment of the invention is to satisfy the major specifications of a power limiter by the use of micro-tips with judiciously selected geometries and distribution on the transmission line 25.

The use of a coplanar technology to produce the transmission line 25 advantageously facilitates the production of the limiter 20. In practice, the use of a coplanar technology makes it possible to obtain a good geometrical accuracy in producing the patterns, and notably in dimensioning, of the transmission line 25, and particularly of the micro-tips 411, 421, 422, 431, 432 of the electrodes.

The micro-tips act as micro-diodes and, depending on their physical composition, they functionally correspond to old vacuum diodes or gas-filled spark tubes. The physical composition of the micro-tips can advantageously be controlled accurately. This therefore makes it possible to adjust the characteristic envelopes of their transfer function. The micro-tips can advantageously be integrated in a quasi-planar technology of monolithic type based on inexpensive materials such as silicon.

The distribution of the micro-tips along the transmission line 50 is used to dissipate the power of a signal travelling along the transmission line 50 over a multitude of distributed sites. The duly distributed power dissipation advantageously makes it possible to reduce the power to be dissipated locally and also makes it possible to increase the destruction threshold of the limiter device 20 relative to conventional limiters.

The current generated by the incident signal in the transmission line 50 circulates in the vacuum or in a gas. This advantageously makes it possible to reduce the leakage currents and the overall losses for low power signals. Furthermore, the breakdown electromagnetic fields in a gas or in a vacuum are higher than in a solid, so the power withstand strength of the limiter device 20 is better than in the conventional limiters. A limiter therefore advantageously makes it possible to withstand high signal powers, of the order of several kilowatts.

The distribution and the redundancy of the micro-tip structures along the transmission line 50 advantageously enables the transmission line to operate in degraded mode. In practice, the destruction or alteration of one or more diodes does not affect the operation of the limiter device 20. The limiter 20 is therefore advantageously robust to repeated electromagnetic disturbances.

The performance characteristics of the limiter 20 at hyperfrequency level are advantageously greater than those of the conventional limiters. It is thus possible to obtain limiter devices with very low losses, of the order of 1 dB, while retaining an operating linearity for weak signals and a good linearity for stronger signals. In practice, the non-linearity is distributed over the whole of the device as is the dissipation.

The power limiter 20 can be produced by employing so-called collective fabrication methods, that is to say methods that do not involve individual manipulation of the components of the limiter. Furthermore, the limiter can be fabricated by technological methods compatible with other types of components such as MEMS. The integration of other active or passive components with the limiter 20 is therefore possible.

One advantage of the limiter is the possibility of entirely designing its limiting characteristics at will: for example, the distribution of the dissipated power along the transmission line 50, the phase shift law for different powers and/or frequencies, a greater or lesser linearity according to the power of the received signal. The dissipation characteristics are, in practice, associated with adjustable characteristics of the structure of the limiter such as: a geometrical pitch between the micro-diodes, a radius of curvature defining the shape of the micro-diode tipstips, a separation between the tipstips, a presence or absence of a gas, a pressure of the gas if such a gas is present, possibly a dynamic adjustment of the limiting thresholds of the limiter device.

The limiter also makes it possible to dynamically adjust the thresholds according to the embodiments used. In practice, it is possible to use threshold adjusting means based on a combination of different physical methods that are totally compatible with the structure of the limiter 20. The physical threshold adjustment methods are advantageously compatible with a production technology that uses a silicon substrate preferentially used for the invention.

Advantageously, the structure of the limiter is intrinsically a wideband structure. The limiter therefore has a wideband behaviour notably by virtue of its passive propagation structure with very high cut-off frequencies for the complete structure of the limiter: cut-off frequencies greater than a hundred or so gigahertz.

The limiter 20 also has a low response time associated with the physical conformation of the limiter device. In practice, the electrons can circulate freely between the electrodes of the transmission line 50. The short response time of the limiter 20 makes it possible to protect equipment, situated downstream of the limiter 20, against electromagnetic pulses with an ultra-short response time, less than a nanosecond.

Another advantage of the distributed limiter is that it is not necessary to heat the structure 801 of the distributed limiter 20 to obtain thermoelectronic effects as in a conventional vacuum diode. The structure of the limiter remains passive, so there is no risk of degradation of the performance characteristics of the limiter following a possible breakdown of a support chip.

The invention claimed is:

1. A power limiter for an electromagnetic signal comprising:
   a transmission line for the signal, of a length that is a function of a wavelength of the signal, said transmission line including:
   a main transmission line for the signal;
   a first ground line;

first passive micro-diodes with ballistic electron transport, said first micro-diodes being connected between the main transmission line and the first ground line, said first micro-diodes being distributed along the transmission line;
a second ground line;
second passive micro-diodes with ballistic electron transport, said second micro-diodes being connected between the main transmission line and the second ground line, said second micro-diodes being distributed along the transmission line;
a cavity, comprising an environment that has a defined composition in terms of chemical species, at a defined pressure, in which the transmission line is placed.

2. The power limiter according to claim 1, wherein the transmission line is produced according to a coplanar technology.

3. The power limiter according to claim 1, wherein the environment is a vacuum environment.

4. The power limiter according to claim 1, wherein the environment comprises at least one inert gas.

5. The power limiter according to claim 1, wherein the environment comprises at least one rare gas.

6. The power limiter according to claim 1, comprising a micro-diode including an anode and a cathode, wherein the anode is implemented by a first micro-tip.

7. The power limiter according to claim 6, wherein the micro-diodes of the transmission line are assembled according to a basic pattern comprising at least one micro-diode comprising an anode and a cathode according to claim 6, said basic pattern being repeated along the transmission line.

8. The power limiter according to claim 6, wherein the micro-diodes of the transmission line are assembled according to a basic pattern comprising at least one micro-diode comprising an anode and a cathode according to claim 6, the basic pattern being repeated along the transmission line by inverting one in every two basic patterns with a symmetry of said basic pattern relative to a longitudinal axis of the transmission line.

9. The power limiter according to claim 6, wherein the cathode is implemented by a second micro-tip.

10. The power limiter according to claim 9, wherein the anode is implemented by a fourth micro-tip of which an end opposite to a base of the fourth micro-tip is truncated.

11. The power limiter according to claim 9, wherein the micro-diodes of the transmission line are assembled according to a basic pattern comprising at least one micro-diode comprising an anode and a cathode according to claim 9, said basic pattern being repeated along the transmission line.

12. The power limiter according to claim 9, wherein the micro-diodes of the transmission line are assembled according to a basic pattern comprising at least one micro-diode comprising an anode and a cathode according to claim 9, the basic pattern being repeated along the transmission line by inverting one in every two basic patterns with a symmetry of said basic pattern relative to a longitudinal axis of the transmission line.

13. The power limiter according to claim 6, wherein the cathode is implemented by a third micro-tip of which an end opposite to a base of the third micro-tip is truncated.

14. The power limiter according to claim 13, wherein the micro-diodes of the transmission line are assembled according to a basic pattern comprising at least one micro-diode comprising an anode and a cathode according to claim 13, said basic pattern being repeated along the transmission line.

15. The power limiter according to claim 13, wherein the micro-diodes of the transmission line are assembled according to a basic pattern comprising at least one micro-diode comprising an anode and a cathode according to claim 13, the basic pattern being repeated along the transmission line by inverting one in every two basic patterns with a symmetry of said basic pattern relative to a longitudinal axis of the transmission line.

16. The power limiter according to claim 1, comprising a micro-diode including an anode and a cathode, wherein the cathode is implemented by a second micro-tip.

17. The power limiter according to claim 16, wherein the micro-diodes of the transmission line are assembled according to a basic pattern comprising at least one micro-diode comprising an anode and a cathode according to claim 16, said basic pattern being repeated along the transmission line.

18. The power limiter according to claim 16, wherein the micro-diodes of the transmission line are assembled according to a basic pattern comprising at least one micro-diode comprising an anode and a cathode according to claim 16, the basic pattern being repeated along the transmission line by inverting one in every two basic patterns with a symmetry of said basic pattern relative to a longitudinal axis of the transmission line.

19. The power limiter according to claim 16, wherein the anode is implemented by a fourth micro-tip of which an end opposite to a base of the fourth micro-tip is truncated.

20. The power limiter according to claim 19, wherein the micro-diodes of the transmission line are assembled according to a basic pattern comprising at least one micro-diode comprising an anode and a cathode according to claim 19, said basic pattern being repeated along the transmission line.

21. The power limiter according to claim 19, wherein the micro-diodes of the transmission line are assembled according to a basic pattern comprising at least one micro-diode comprising an anode and a cathode according to claim 19, the basic pattern being repeated along the transmission line by inverting one in every two basic patterns with a symmetry of said basic pattern relative to a longitudinal axis of the transmission line.

22. The power limiter according to claim 1, further comprising at least one substrate structure suitable for receiving a high-frequency electromagnetic signal, said structure comprising two substrate wafers encapsulating at least one cavity.

23. The power limiter according to claim 22, wherein the cavity comprises at least one port and that external means are implemented to control the pressure and the composition in terms of chemical species inside the cavity.

24. The power limiter according to claim 22, further comprising a piezoelectric material generating standing acoustic wave trains focussed on spaces between the micro-tips of the limiter.

25. The power limiter according to claim 22, further comprising a piezoelectric material generating standing acoustic wave trains focussed on the micro-tips of the limiter.

26. The power limiter according to claim 22, wherein at least one substrate is transparent.

27. The power limiter according to claim 22, further comprising at least one triggering electrode.

28. The power limiter according to claim 22, wherein the electromagnetic signal is transmitted to the power limiter through one of the substrates by reactive coupling.

29. The power limiter according to claim 28, wherein the coupling is a capacitive coupling.

30. The power limiter according to claim 28, wherein the coupling is an inductive coupling.

31. The power limiter according to claim 22, wherein the cavity is air-tight.

32. The power limiter according to claim 31, wherein the substrate wafers are assembled by eutectic welding.

33. The power limiter according to claim 31, wherein the substrate wafers are assembled by anodic welding.

34. The power limiter according to claim 31, wherein the substrate wafers are assembled by thermocompression.

* * * * *